United States Patent
Park et al.

(10) Patent No.: US 9,589,850 B1
(45) Date of Patent: Mar. 7, 2017

(54) METHOD FOR CONTROLLED RECESSING OF MATERIALS IN CAVITIES IN IC DEVICES

(71) Applicant: GLOBALFOUNDRIES Inc., Grand Cayman (KY)

(72) Inventors: Chanro Park, Clifton Park, NY (US); Kisup Chung, Slingerlands, NY (US); Sivananda Kanakasabapathy, Schenectady, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/964,746

(22) Filed: Dec. 10, 2015

(51) Int. Cl.
*H01L 21/8238* (2006.01)
*H01L 29/49* (2006.01)

(52) U.S. Cl.
CPC .......... *H01L 21/823842* (2013.01); *H01L 21/823857* (2013.01); *H01L 21/823864* (2013.01); *H01L 29/4966* (2013.01)

(58) Field of Classification Search
CPC ..... H01L 21/823842; H01L 21/823857; H01L 21/823864; H01L 29/4966
See application file for complete search history.

(56) References Cited

U.S. PATENT DOCUMENTS

| | | | |
|---|---|---|---|
| 2005/0064610 A1* | 3/2005 | Bruley ................ | G01R 31/307 438/14 |
| 2013/0093048 A1* | 4/2013 | Chang ................ | H01L 21/02112 257/532 |
| 2013/0187236 A1* | 7/2013 | Xie ..................... | H01L 29/4966 257/369 |
| 2015/0243754 A1* | 8/2015 | Wu ..................... | H01L 29/4966 257/412 |
| 2016/0211156 A1* | 7/2016 | Singh ................ | H01L 21/67213 156/345.52 |

* cited by examiner

*Primary Examiner* — Scott B Geyer
*Assistant Examiner* — Brigitte Paterson
(74) *Attorney, Agent, or Firm* — Ditthavong & Steiner, P.C.

(57) ABSTRACT

Controlled recessing of materials in cavities and resulting devices are disclosed. Embodiments include providing a dielectric layer over first-type and second-type transistor regions, and long and short channel-cavities in the dielectric in each transistor region; conformally forming a gate dielectric layer in the long and short channel-cavities, and on an upper surface of the dielectric; conformally forming a first-type work-function metal layer on the gate dielectric; forming a block-mask over the first-type transistor region; removing the first-type work-function metal from the second-type transistor region; removing the block-mask; conformally forming a second-type work-function metal on all exposed surfaces; forming a metal barrier layer on exposed surfaces and filling the short channel-cavities; filling the long channel-cavities with a conductive material; planarizing all layers down to the upper surface of the dielectric; and applying a tilted ion beam to recess the gate dielectric, first and second type work-function metal, and metal barrier layers.

15 Claims, 11 Drawing Sheets

BACKGROUND

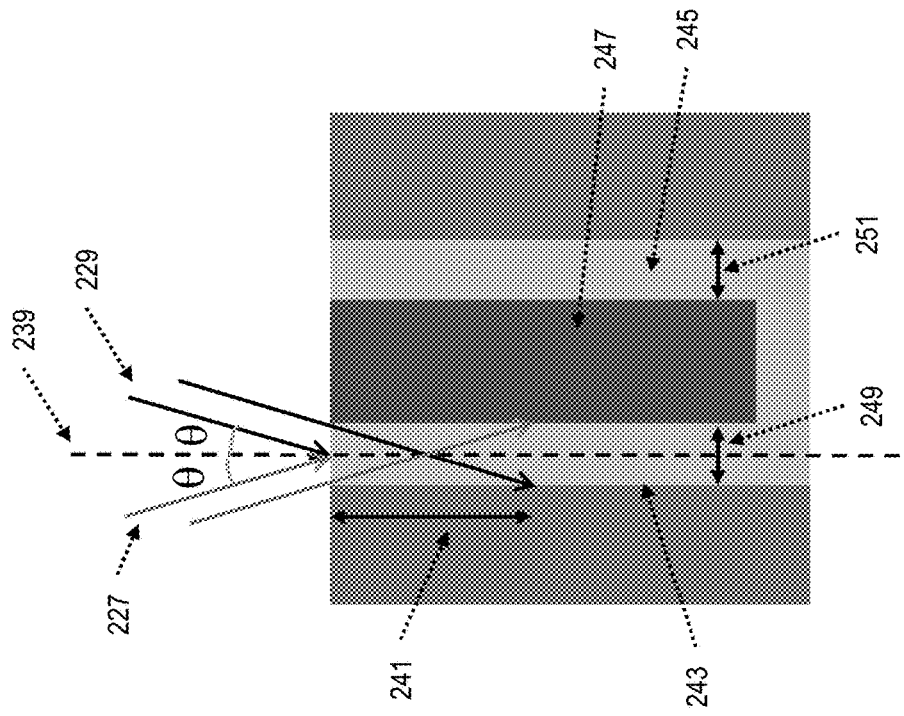
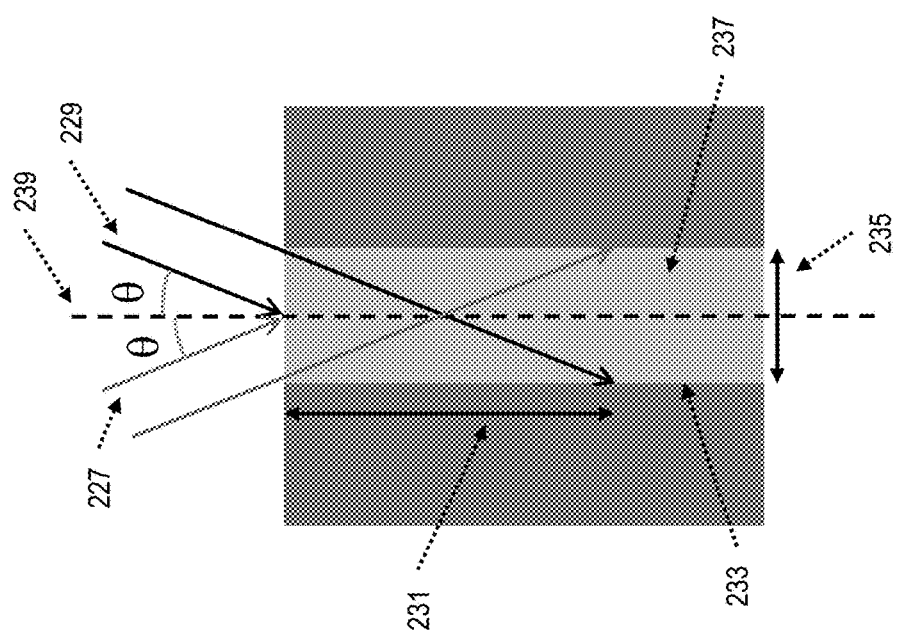
FIG. 2K
FIG. 2J

METHOD FOR CONTROLLED RECESSING OF MATERIALS IN CAVITIES IN IC DEVICES

TECHNICAL FIELD

The present disclosure relates generally to designing and fabricating integrated circuit (IC) devices. The present disclosure is applicable to processes for recessing work-function metals in fabrication of IC devices.

BACKGROUND

Generally, in the fabrication of an IC device, various processes may be utilized to etch/recess materials in cavities used in creating the circuits. The cavities may have different shapes or sizes and may be filled with different materials. For example, a cavity may include different layers of materials for spacers, gate dielectric, work-function metals, other dielectrics, or the like. Some of the current time-based etching processes include plasma etching of gap-fill materials followed by plasma or wet removal of the work-function metal. Another process includes pinching-off the gate cavity with work-function metal and plasma etching the work-function metal to reach a target recess depth. Such processes may require additional mask steps and processing time. Also, these etching processes may not be suitable for controlling the etching to a precise depth, where the recess depth may depend on a cavity dimension and be affected by plasma condition (e.g., etch chamfer stability).

FIG. 1 is a cross sectional diagram 101 of cavities in an example IC device, where a filling material 103 (e.g., gate metal) in cavities 105 is to be recessed to a recess depth level 107. However, as illustrated, the filling materials 103 in the cavities 105 are not recessed to a same level (e.g., level 107), as some are recessed to lower depths. For example, the filling materials 103 may include some imperfections such as seams 109 or voids/gaps 111 that may be present at different depths in the cavities 105, wherein the seams and/or voids may impact a target recess depth. Further, with work-function metal recesses formed by an ODL recess, the high-k dielectric may be chamfered for shorter gates to insure sufficient space for the ODL.

A need therefore exists for a methodology enabling recessing of materials in cavities, in an IC device, with precise depth control and the resulting device.

SUMMARY

Aspects of the present disclosure are methods for recessing of materials in cavities, in an IC device, with precise depth control and the resulting device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a dielectric layer over first and second type transistor regions, and long channel-cavities and short channel-cavities in the dielectric layer in each transistor region; conformally forming a gate dielectric layer in the long and short channel-cavities, and on an upper surface of the dielectric layer; conformally forming a first-type work-function metal layer on the gate dielectric layer; forming a block mask over the first-type transistor region; removing the first-type work-function metal layer from the second-type transistor region; removing the block mask; conformally forming a second-type work-function metal layer on all exposed surfaces; forming a metal barrier layer on exposed surfaces and filling the short channel-cavities; filling the long channel-cavities with a conductive material; planarizing all layers down to the upper surface of the dielectric layer; and applying a tilted ion beam to recess the gate dielectric, first and second-type work function metal, and metal barrier layers.

Another aspect includes controlling a recess depth in the long and short channel-cavities based on a ratio of a width of work-function metal materials in the long channel-cavities or a gate length in the short channel-cavities and a tangent of an angle of the tilted ion beam with respect to a line perpendicular to an upper surface of the dielectric layer.

A further aspect includes applying dual tilted ion beams, wherein a pair of crossing adjacent ion beams forms adjacent angles with respect to a line perpendicular to an upper surface of the Si substrate.

In some aspects, the ion beams have an energy level of 20 to 100 electron volts. In one aspect, the first and second type transistor regions are p-type and n-type, respectively, and wherein the first and second type work-function metal layers are p-type and n-type, respectively. In another aspect, the conductive material is tungsten.

Additional aspects include recessing layers in the short channel-cavities to a lower depth than in the long channel-cavities. Further aspects include forming spacers on sidewalls of the long and short channel-cavities prior to forming the gate dielectric layer. Some aspects include utilizing an ion-beam etch selective to the dielectric layer, the conductive material, and the spacers.

Another aspect of the present disclosure includes a method providing a dielectric layer over p-type and n-type transistor regions, and long channel-cavities and short channel-cavities in the dielectric layer in each transistor region; conformally forming a gate dielectric layer in the long and short channel-cavities, and on an upper surface of the dielectric layer; conformally forming a n-type work-function metal layer on the gate dielectric layer; forming a block mask over the n-type transistor region; removing the n-type work-function metal layer from the p-type transistor region; removing the block mask; conformally forming a p-type work-function metal layer on all exposed surfaces; forming a metal barrier layer on exposed surfaces and filling the short channel-cavities; filling the long channel-cavities with a conductive material; planarizing all layers down to the upper surface of the dielectric layer; and applying a tilted ion beam to recess the gate dielectric, p-type and n-type work function metal, and metal barrier layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2K schematically illustrate a process flow for recessing materials in cavities, in an IC device, with precise depth control, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of variations of etching results attendant upon recessing of work-function metals in cavities in an IC device. The present disclosure addresses and solves such problems, for instance, by, inter alia, utilizing tilted ion beams selective to material layers in a cavity.

FIGS. 2A through 2K schematically illustrate a process flow for recessing materials in cavities, in an IC device, with precise depth control, in accordance with an exemplary embodiment.

Figure 1:
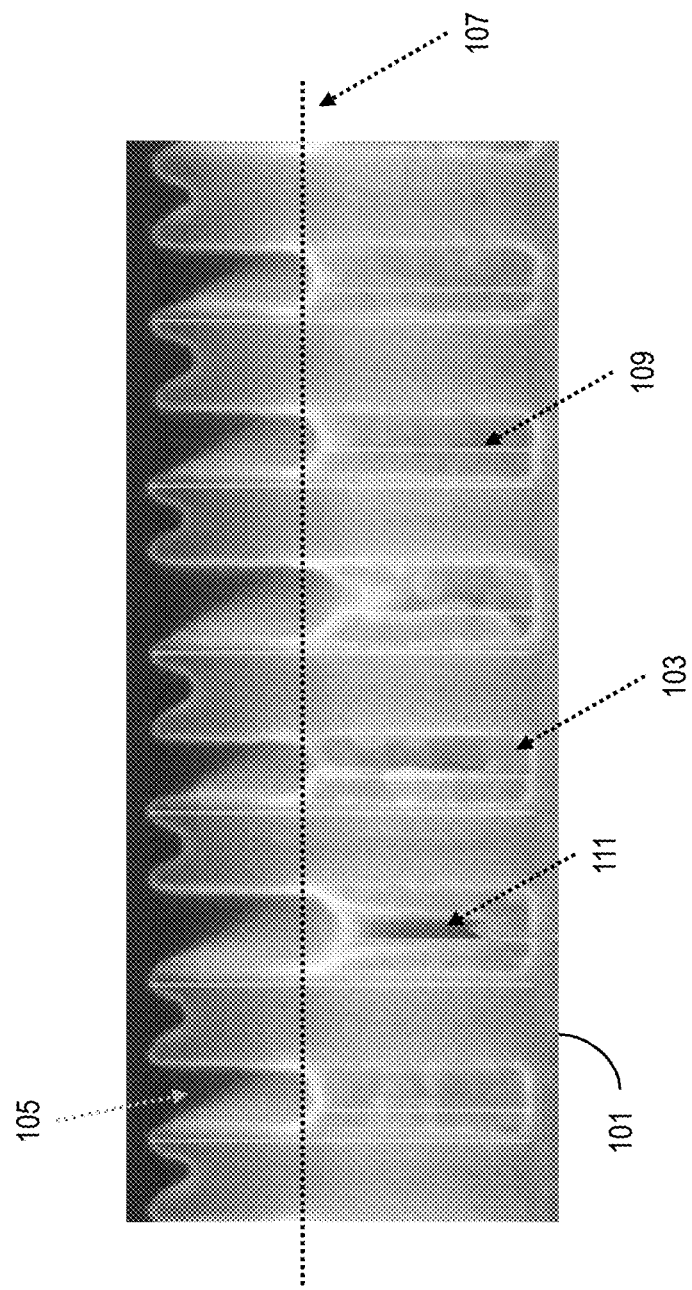
FIG. 1 is a cross sectional diagram of cavities in an example IC device.
Figure 2A:
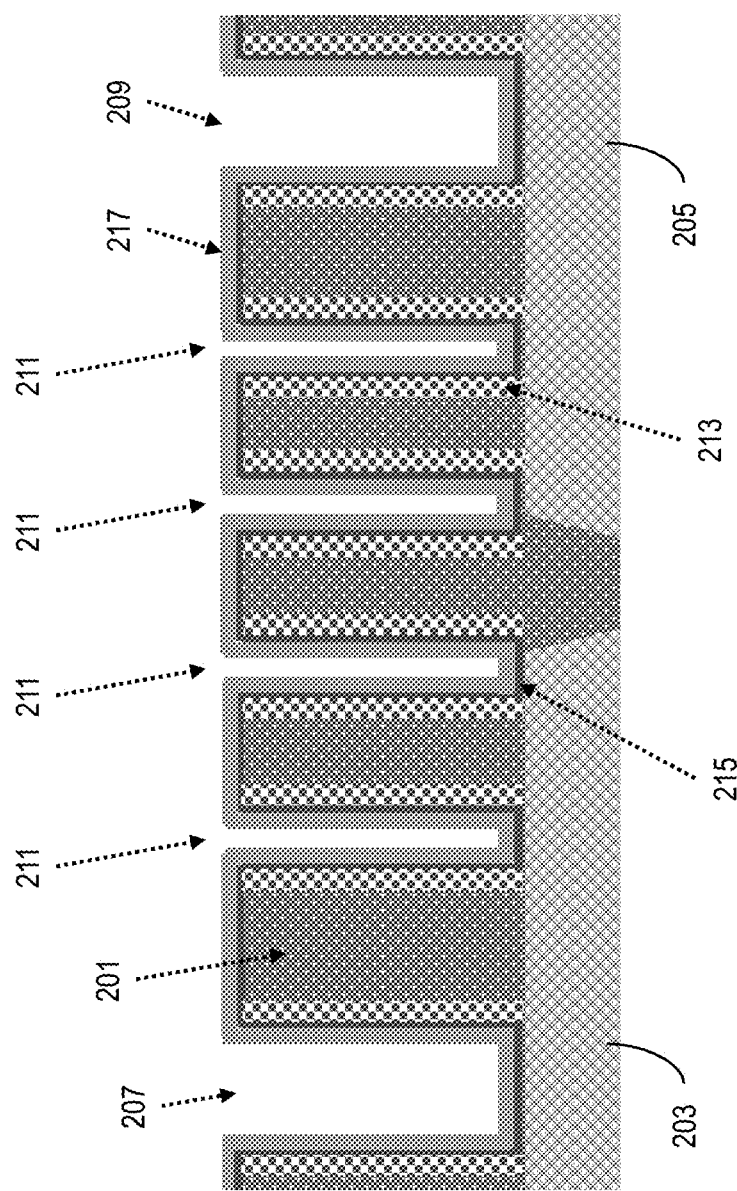

FIG. 2A illustrates a silicon dioxide ($SiO_2$) dielectric layer 201 over p-type, 203, and n-type, 205, transistor regions; and long channel-cavities 207 and 209, and short channel-cavities 211 in the dielectric layer 201 in the transistor regions. For example, the cavities may be formed by use of one or more IC fabrication etching processes. Silicon nitride or a low-k dielectric (e.g., silicon born carbon nitride, silicon oxy-carbon nitride, silicon oxy-carbide) may be utilized to form (e.g., via chemical vapor deposition (CVD), or atomic layer deposition (ALD)) spacer layers 213 on sidewalls of the long and short channel-cavities. A gate dielectric layer 215 (e.g., a high-k dielectric) may be formed (e.g., via ALD) in the long and short channel-cavities as well as on an upper surface of the $SO_2$ dielectric layer 201. Next, a p-type work-function metal layer 217 may be formed on the gate dielectric layer 215.

Figure 2B:
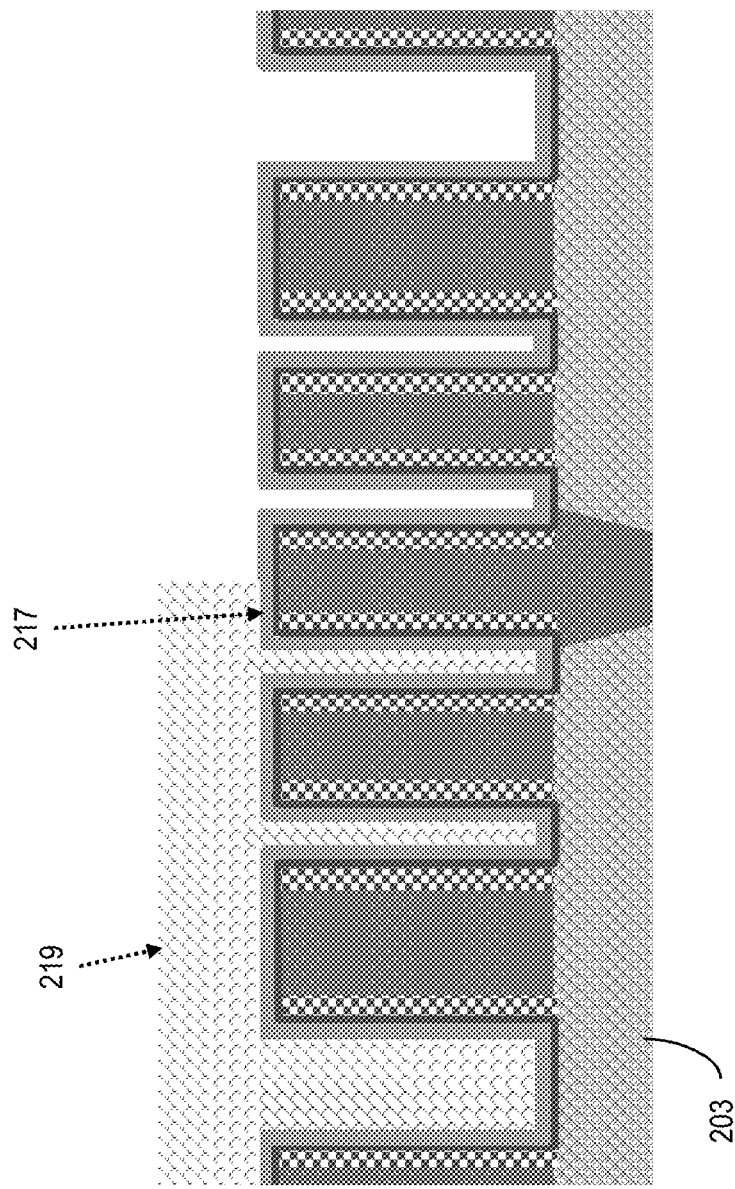

Adverting to FIG. 2B, a block mask 219 may be formed over exposed p-type work-function metal surfaces 217 in the p-type transistor region 203 to block the p-type work-function metal layer 217 in that region, for example, from an etching process.

Figure 2C:
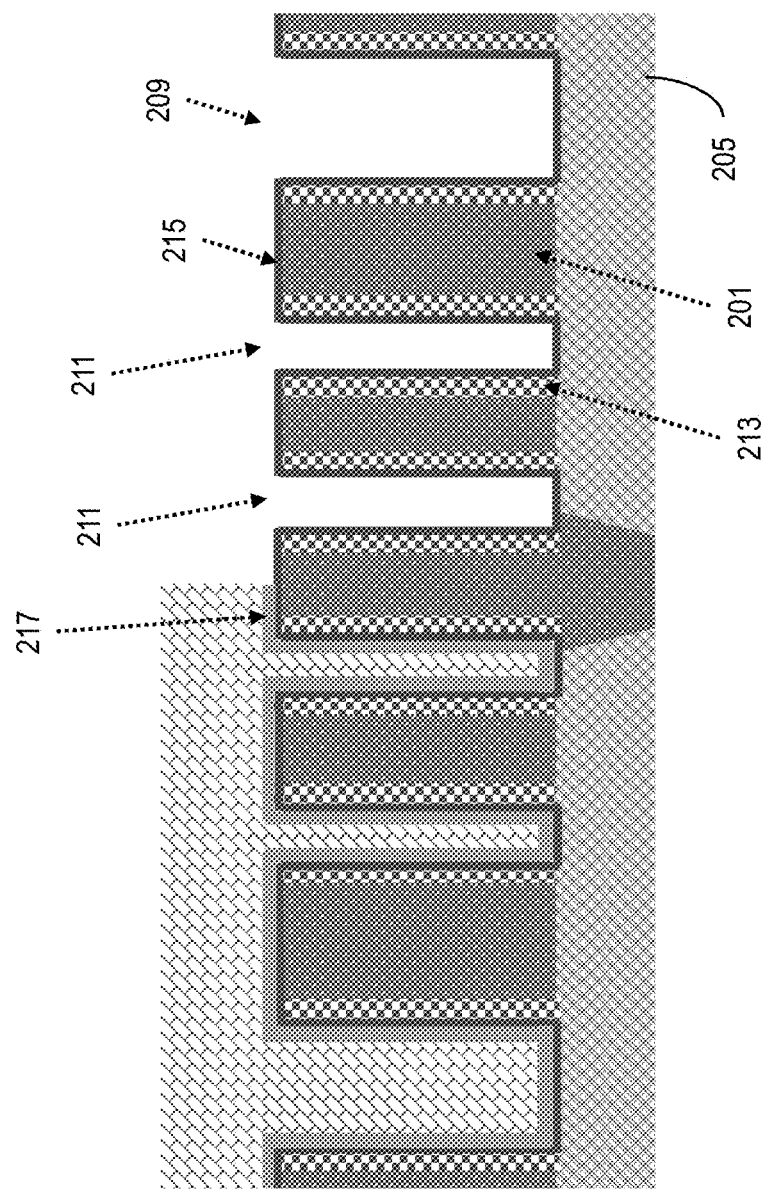
Figure 2D:
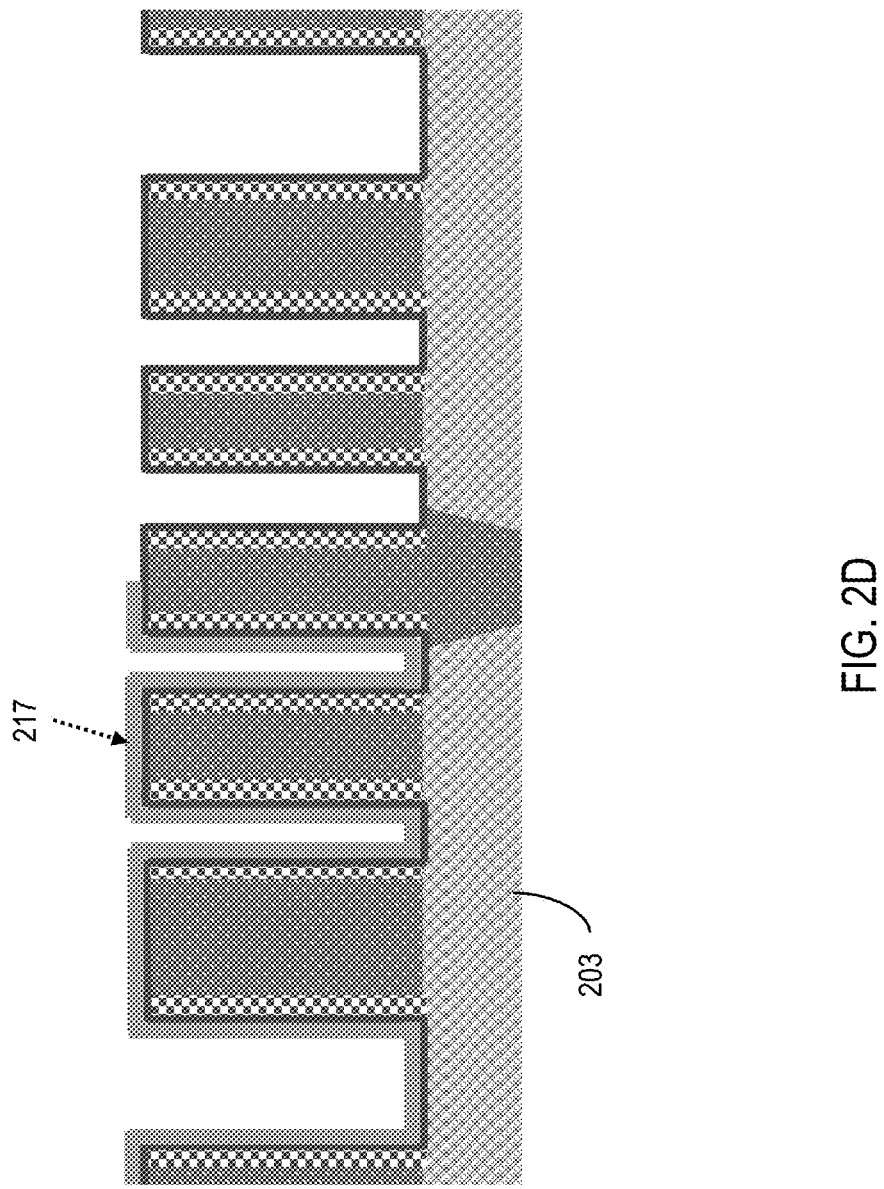

As illustrated in FIG. 2C, sections of the p-type work-function metal layer 217 that are in the n-type transistor region 205 may be removed, exposing the gate dielectric layer 215 previously formed on the upper surfaces of the $SO_2$ dielectric layer 201 and the spacers 213, and in the cavities 211 and 209. Adverting to FIG. 2D, the block mask is removed from the p-type transistor region 203 where sections of the p-type work-function metal layer 217 remain.

Figure 2E:
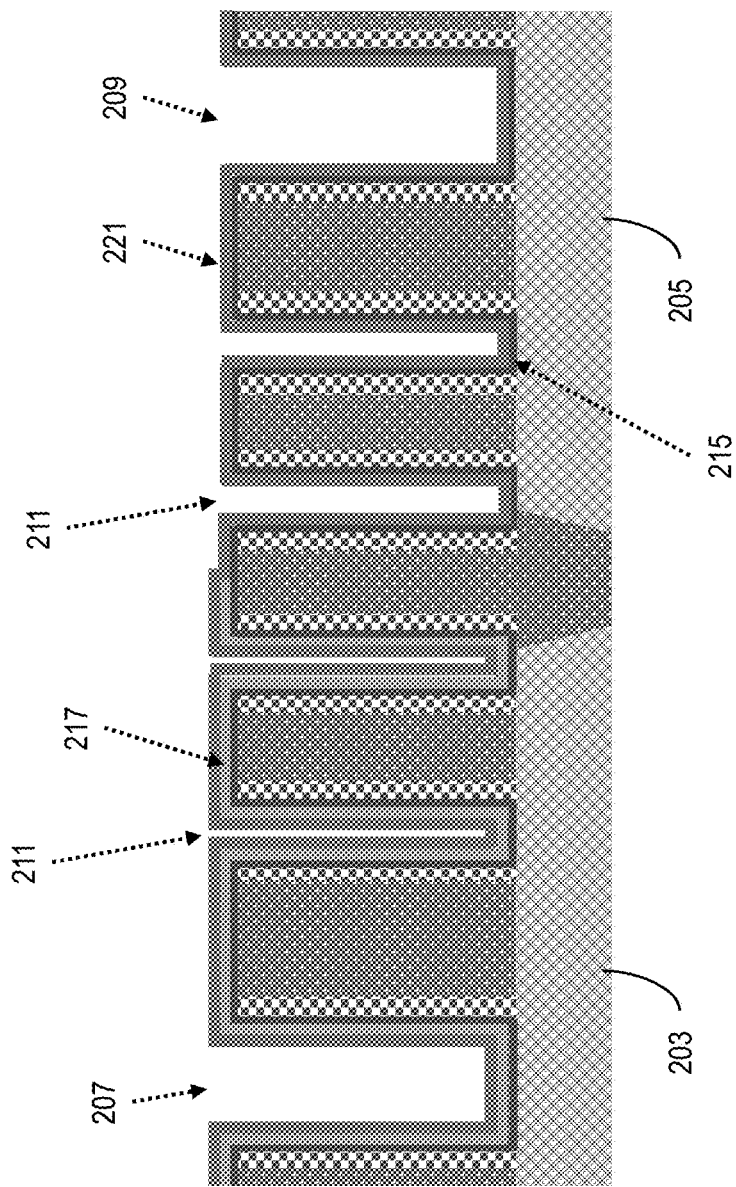

Adverting to FIG. 2E, an n-type work-function metal layer 221 may be conformally formed on all exposed surfaces. As illustrated, in the p-type transistor region 203, the n-type work-function metal layer 221 is formed on the p-type work-function metal layer 217; however, in the n-type transistor region 205, the n-type work-function metal layer 221 is formed on the gate dielectric layer 215. As a result, the cavities 207 and 211 in the p-type transistor region 203 include both p-type and n-type work-function metal layers (in addition to the other material layers) leaving a narrow unfilled space in those cavities, wherein the cavities 209 and 211 in the n-type transistor region 205 that include only n-type work-function metal layer (in addition to the other material layers) leaving a wider unfilled space in the cavities.

It is noted that alternatively, instead of forming the p-type work-function metal layer 217 on the gate dielectric layer 215 first (as in FIG. 2A), the n-type work-function metal layer 221 may be formed on the gate dielectric layer 215 first (not shown for illustrative convenience). In that case, the block mask 219 may be utilized to block the n-type work-function metal layer 221 in the n-type transistor region 205 so that sections of the n-type work-function metal layer 221 that are in the p-type transistor region 203 may be removed. Next, instead of forming an n-type work-function metal layer 221 on all exposed surfaces (as in FIG. 2E), a p-type work-function metal layer 217 may be formed. In this scenario, the long channel-cavity 207 may include only the p-type work-function metal layer 217, where the long channel-cavity 209 may include both p-type and n-type work-function metal layers (instead of just the n-type as illustrated in FIG. 2E.) In either scenario (forming a p-type or an n-type work-function metal layer first), the remaining process steps may be similar to those discussed below.

Figure 2F:
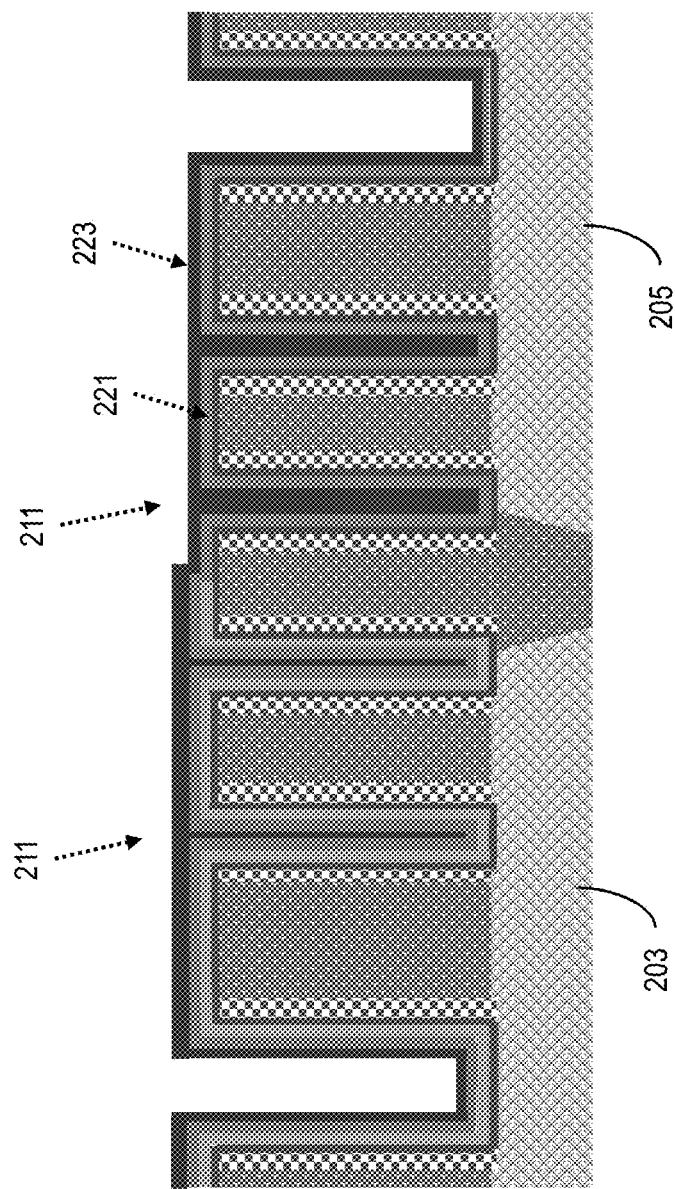

Adverting to FIG. 2F, a metal barrier layer 223 may be formed on exposed surfaces on the n-type work-function metal layer 221 in the transistor regions 203 and 205, wherein the short channel-cavities 211 in both regions 203 and 205 are filled with the metal barrier material (e.g., titanium nitride (TiN), titanium aluminum (TiAl), etc.)

Figure 2G:
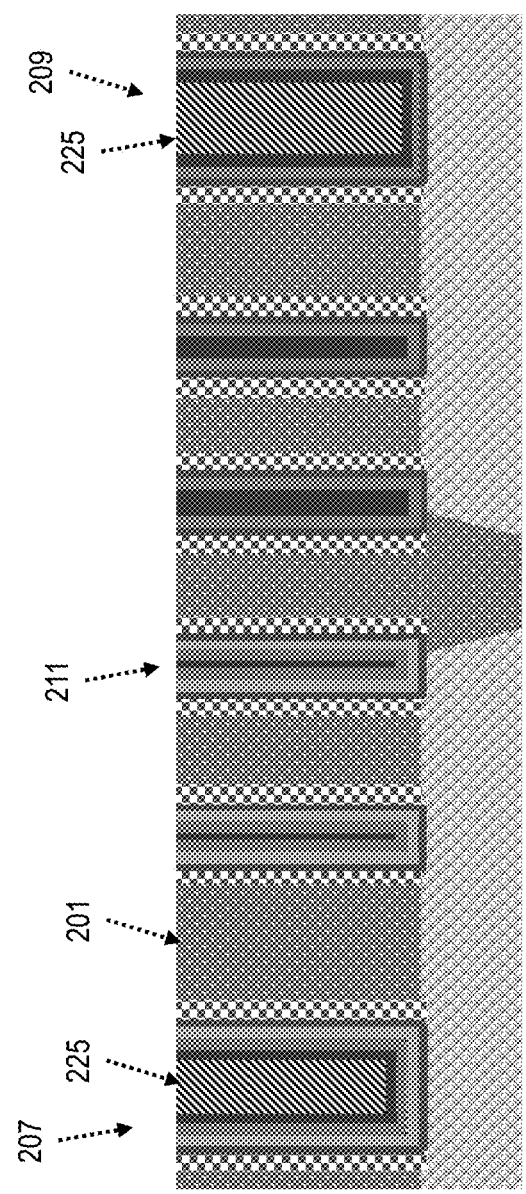

In FIG. 2G, the long channel-cavities 207 and 209 may be filled with a conductive material 225 (e.g., tungsten) and then all material layers in the long, 207/209, and short channels 211 may be planarized (e.g., by a chemical mechanical polishing process) down to the upper surface of the $SiO_2$ dielectric layer 201.

Figure 2H:
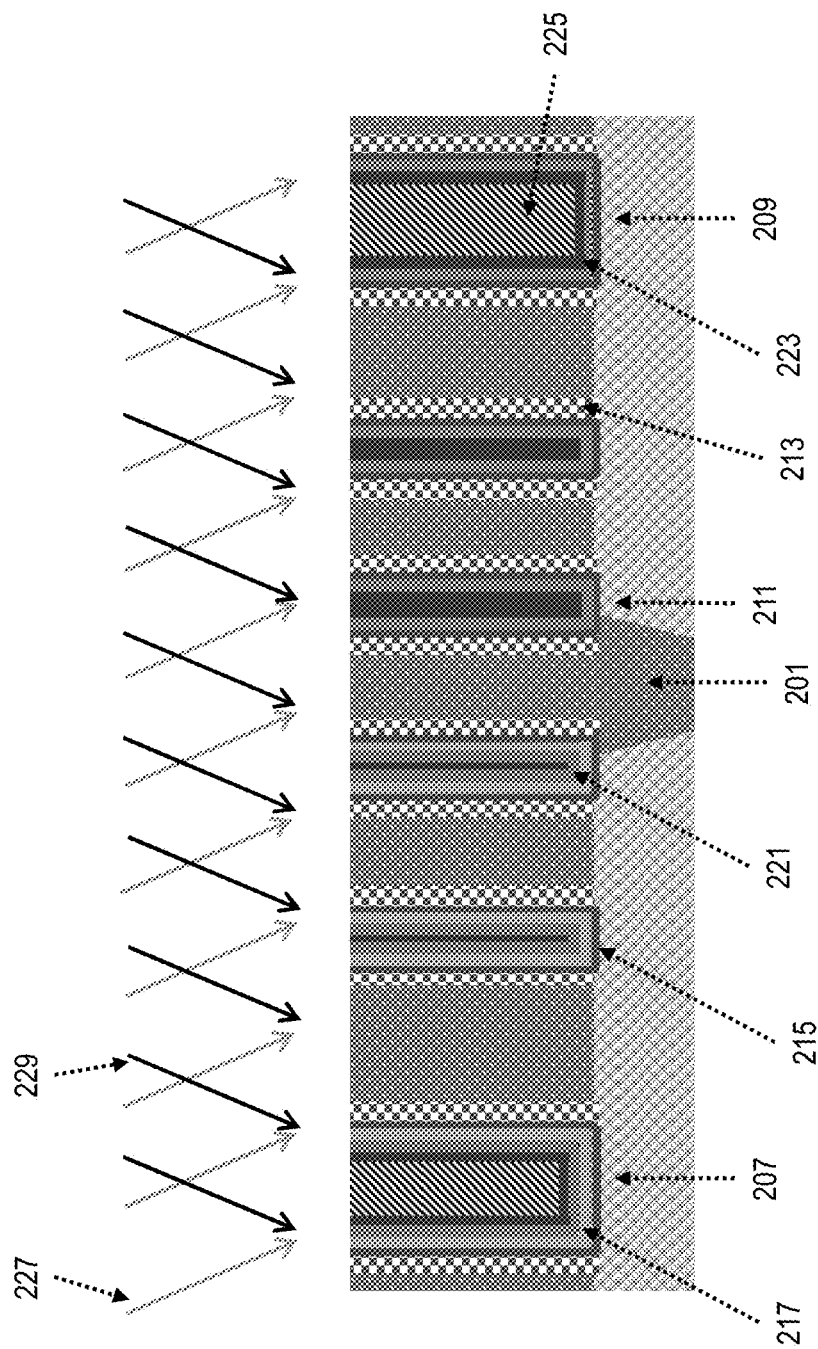

Adverting to FIG. 2H, tilted ion beams 227 (e.g., sourced by chlorine gas ($Cl_2$), boron trichloride ($BCl_3$), etc.) and/or 229 may be applied to recess the gate dielectric layer 215, p-type 217 and n-type 221 work function metal layers, and the metal barrier layer 223 as they may be present in the long, 207/209, and short, 211, channels (e.g., selective to the $SiO_2$ dielectric layer 201, the conductive material 225, and the spacers 213). The ion beams may have an energy level of 20 to 100 electron volts. Utilizing dual ion beams 227 and 229 may provide an advantage in the IC fabrication processing throughput.

Figure 2I:
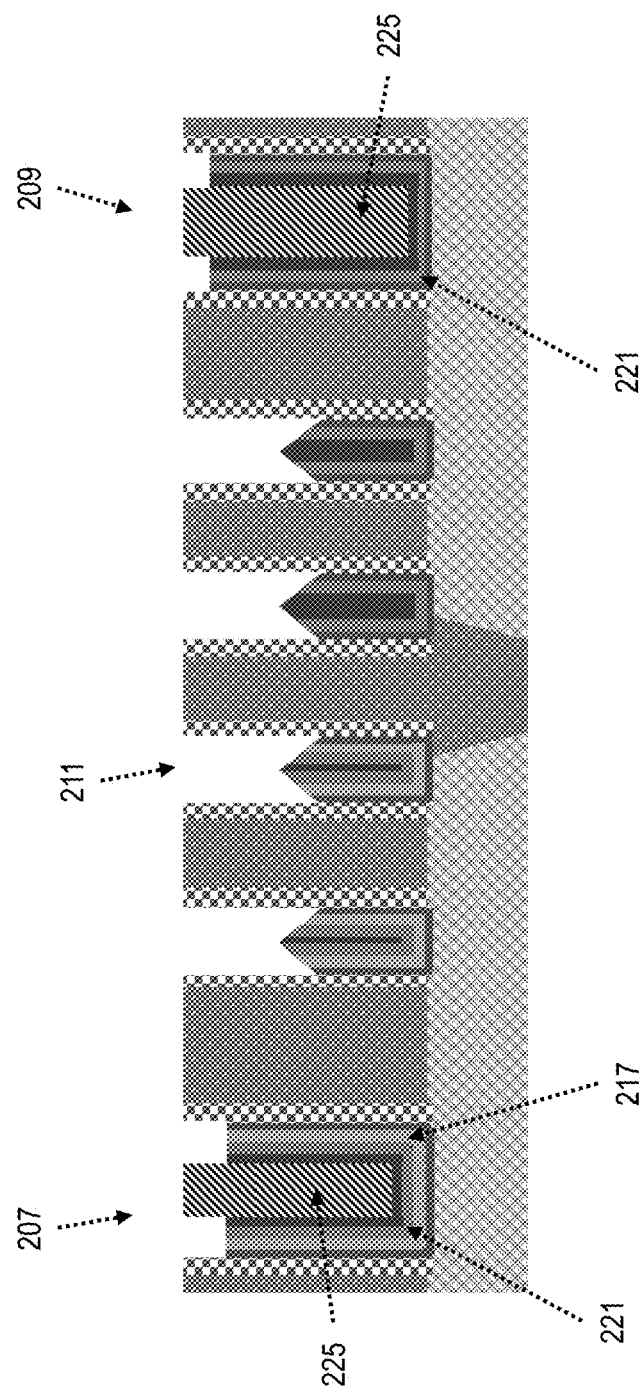

FIG. 2I illustrates the recessed material layers in the long, 207/209, and short, 211, channel-cavities. As illustrated, the material layers in the short channel-cavities 211 are recessed to a lower depth than the material layers in the long channel-cavities 207/209. Also, material layers in the long channel-cavity 207 are recessed to a lower depth than the material layers in the long channel-cavity 209. The difference in the recess depths in the long channel-cavities 207 and 209 is due to the difference in a width of the work-function materials present in each cavity on either side of the conductive material 225. The long channel-cavity 207 includes both p-type, 217, and n-type, 221, work-function metal layers, wherein the long channel-cavity 209 includes the n-type, 221, only. The differences in the recess depths in the long channel-cavities 207 and 209, and the short channel-cavities are due to the differences in the width of the work-function materials present in the long channel-cavities 207 and 209, in each cavity on either side of the conductive material 225, and the width of the work-function materials present in the short channel-cavities 211. The mathematical basis for the differences is further discussed below in relation with FIGS. 2J and 2K.

FIG. 2J illustrates geometrical factors that may be utilized to control a recess depth 231 in a cavity 233 (e.g., a short channel-cavity 211). The recess depth 231 may be determined and controlled based on a ratio of a width 235 of the metal gate (or a gate length 235) in the cavity 233 and a tangent of an angle of the tilted ion beam 227 or 229, where the pair of crossing adjacent ion beams 227 and 229 form adjacent angles "0" with respect to a line 239 perpendicular to an upper surface of the work-function metal materials 237.

FIG. 2K illustrates geometrical factors that may be utilized to control a recess depth 241 in a cavity 243 (e.g., a long channel-cavity 207/209). The cavity 243 includes work-function materials 245 and other materials (e.g., W) 247 that are not to be recessed. The recess depth 241 may be determined and controlled based on a ratio of a width 249 or 251 of the work-function materials 245 and a tangent of an angle of the tilted ion beam 227 or 229, where the pair of crossing adjacent ion beams 227 and 229 form adjacent angles "0" with respect to a line 239 perpendicular to an upper surface of the work-function metal materials 249 or 251.

The embodiments of the present disclosure can achieve several technical effects, including recessing materials in cavities in an IC device to a precise recess depth, where a target recess depth is not impacted by seams, voids or other imperfections in the materials. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a dielectric layer over first and second type transistor regions;
providing first channel-cavities and second channel-cavities in the dielectric layer in each of the first and second type transistor regions, wherein the first channel-cavities have a greater width than the second channel-cavities;
conformally forming a gate dielectric layer in the first and second channel-cavities, and on an upper surface of the dielectric layer;
conformally forming a first-type work-function metal layer on the gate dielectric layer;
forming a block mask over the first-type transistor region;
removing the first-type work-function metal layer from the second-type transistor region;
removing the block mask;
conformally forming a second-type work-function metal layer on all exposed surfaces;
forming a metal barrier layer on exposed surfaces and filling the second channel-cavities;
filling the first channel-cavities with a conductive material;
planarizing all material layers in the first channel-cavities and the second channel-cavities down to the upper surface of the dielectric layer, where the material layers comprise the second-type work-function metal layer, the metal barrier layer, and the conductive material; and
applying dual tilted ion beams to recess the gate dielectric, first and second-type work function metal, and metal barrier layers, wherein a pair of crossing adjacent ion beams forms adjacent angles with respect to a line perpendicular to an upper surface of the first-type work function metal layer and the second-type work function metal layer, and
wherein the ion beams have an energy level of 20 to 100 electron volts.

2. The method of claim 1, further comprising:
controlling a recess depth in the first and second channel-cavities based on one of a ratio of a width of work-function metal materials in the first channel-cavities or a ratio of a gate length in the second short channel-cavities and a tangent of an angle of the tilted ion beam with respect to a line perpendicular to an upper surface of the dielectric layer.

3. The method of claim 1, wherein the first and second type transistor regions are p-type and n-type, respectively, and wherein the first and second type work-function metal layers are p-type and n-type, respectively.

4. The method of claim 1, wherein the conductive material is tungsten.

5. The method of claim 1, comprising recessing the gate dielectric, the first- and second-type work function metal, and metal barrier layers in the second channel-cavities to a lower depth than the gate dielectric, the first- and second-type work function metal, and metal barrier layers in the first channel-cavities.

6. The method of claim 1, further comprising:
forming spacers on sidewalls of the first and second channel-cavities prior to forming the gate dielectric layer.

7. The method of claim 6, further comprising: utilizing the dual tilted ion beams to provide an ion-beam etch selective to the dielectric layer, the conductive material, and the spacers.

8. A method comprising:
providing a dielectric layer over p-type and n-type transistor regions, and first channel-cavities and second channel-cavities in the dielectric layer in each of the p-type and n-type transistor regions, wherein the first channel-cavities have a greater width than the second channel-cavities;

conformally forming a gate dielectric layer in the first and second channel-cavities, and on an upper surface of the dielectric layer;
conformally forming an n-type work-function metal layer on the gate dielectric layer;
forming a block mask over the n-type transistor region;
removing the n-type work-function metal layer from the p-type transistor region;
removing the block mask;
conformally forming a p-type work-function metal layer on all exposed surfaces;
forming a metal barrier layer on exposed surfaces and filling the second channel-cavities;
filling the first channel-cavities with a conductive material;
planarizing all material layers in the first channel-cavities and the second channel-cavities down to the upper surface of the dielectric layer, where the material layers comprise the p-type work-function metal layer, the metal barrier layer and the conductive material; and
applying dual tilted ion beams to recess the gate dielectric, p-type and n-type work function metal, and metal barrier layers, wherein a pair of crossing adjacent ion beams forms adjacent angles with respect to a line perpendicular to an upper surface of the n-type work function metal layer and the p-type work function metal layer, and
wherein the ion beams have an energy level of 20 to 100 electron volts.

9. The method of claim 8, further comprising:
controlling a recess depth in the first and second channel-cavities based on one of a ratio of a width of work-function metal materials in the first channel-cavities or a ratio of a gate length in the second channel-cavities and a tangent of an angle of the dual tilted ion beams with respect to a line perpendicular to an upper surface of the dielectric layer.

10. The method of claim 8, further comprising:
forming spacers on sidewalls of the first and second channel-cavities prior to forming the gate dielectric layer.

11. The method of claim 8, wherein the conductive material is tungsten.

12. The method of claim 8, comprising recessing layers in the second channel-cavities to a lower depth than in the first channel-cavities.

13. A method comprising:
providing a silicon dioxide (SiO2) dielectric layer over p-type and n-type transistor regions;
providing first channel-cavities and second channel-cavities in the SiO2 dielectric layer in each of the p-type and n-type transistor regions, wherein the first channel-cavities have a greater width than the second channel-cavities;
forming silicon nitride spacer layers on sidewalls of the first and second channel-cavities;
conformally forming a high-k gate dielectric layer in the first and second channel-cavities, and on an upper surface of the SiO2 dielectric layer;
conformally forming a p-type work-function metal layer on the high-k gate dielectric layer;
forming a block mask over the p-type transistor region;
removing the p-type work-function metal layer from the n-type transistor region;
removing the block mask;
conformally forming an n-type work-function metal layer on all exposed surfaces;
forming a metal barrier layer on exposed surfaces and filling the second channel-cavities;
filling the first channel-cavities with tungsten;
planarizing all material layers in the first channel-cavities and the second channel-cavities down to the upper surface of the SiO2 dielectric layer, where the material layers comprise the n-type work-function metal layer, the metal barrier layer, and the tungsten; and
applying dual tilted ion beams to recess the high-k gate dielectric layer, p-type and n-type work-function metal, and metal barrier layers; and
applying the dual tilted ion beams, wherein a pair of crossing adjacent ion beams form adjacent angles with respect to a line perpendicular to an upper surface of the n-type work function metal layer and the p-type work function metal layer, wherein the ion beams have an energy level of 20 to 100 electron volts, and wherein the ion beams are selective to the SiO2, silicon nitride, and tungsten.

14. The method of claim 13, further comprising:
controlling a recess depth in the first and second channel-cavities based on one of a ratio of a width of work-function materials in the first channel-cavities or a ratio a gate length in the second channel-cavities and a tangent of an angle of the tilted ion beam with respect to a line perpendicular to an upper surface of the dielectric layer.

15. The method of claim 13, comprising recessing the high-k gate dielectric, the p- and n-type work function metal, and metal barrier layers in the second channel-cavities to a lower depth than the high-k gate dielectric, the p- and n-type work function metal, and metal barrier layers in the first channel-cavities.

* * * * *